United States Patent [19]

Casey et al.

[11] Patent Number: 5,480,503

[45] Date of Patent: Jan. 2, 1996

[54] PROCESS FOR PRODUCING CIRCUITIZED LAYERS AND MULTILAYER CERAMIC SUB-LAMINATES AND COMPOSITES THEREOF

[75] Inventors: Jon A. Casey, Poughkeepsie; David B. Goland, Croton; Dinesh Gupta, Poughkeepsie; Lester W. Herron, Hopewell Junction; James N. Humenik, LaGrangeville; Thomas E. Lombardi, Wappingers Falls; John U. Knickerbocker, Hopewell Junction; Robert J. Sullivan, Pleasant Valley, all of N.Y.; James R. Wylder, Round Rock, Tex.

[73] Assignee: International Business Machines Corporation, Armonk, N.Y.

[21] Appl. No.: 175,727

[22] Filed: Dec. 30, 1993

[51] Int. Cl.$^6$ .......................... B32B 31/04; B32B 31/12; B32B 31/28; B32B 31/26

[52] U.S. Cl. .......................... 156/89; 156/235; 156/239; 156/249; 156/252; 156/272.2; 156/289; 156/344; 29/830; 29/831

[58] Field of Search ................ 29/830, 831; 156/89, 156/233, 272.2, 273.3, 275.5, 235, 72.8, 289, 344

[56] References Cited

U.S. PATENT DOCUMENTS

| | | | |
|---|---|---|---|
| 3,870,776 | 3/1975 | McMahon | 264/61 |
| 3,882,059 | 5/1975 | Elderbaum | 156/89 X |
| 3,948,706 | 4/1976 | Schmeckenbecker | 156/89 |
| 4,799,983 | 1/1989 | Desai | 156/89 |
| 4,889,573 | 12/1989 | Stein et al. | 156/89 |
| 4,933,124 | 6/1990 | Duncan | 156/244.11 X |
| 4,977,006 | 12/1990 | Smith et al. | 156/247 X |
| 5,009,744 | 4/1991 | Mandai et al. | 156/89 X |
| 5,046,238 | 9/1991 | Daigle et al. | 29/830 |
| 5,104,707 | 4/1992 | Watanabe et al. | 156/233 X |
| 5,120,590 | 6/1992 | Savage et al. | 156/233 X |
| 5,271,150 | 12/1993 | Inasaka | 29/830 X |
| 5,356,512 | 10/1994 | Hosokawa | 156/89 X |

FOREIGN PATENT DOCUMENTS

| | | | |
|---|---|---|---|
| 0425148 | 5/1991 | European Pat. Off. | 156/89 |
| 4-97590 | 3/1992 | Japan | 29/830 |
| 4-97591 | 3/1992 | Japan | 29/830 |
| 1443781 | 6/1991 | U.S.S.R. | 29/830 |

*Primary Examiner*—David A. Simmons
*Assistant Examiner*—M. Curtis Mayes
*Attorney, Agent, or Firm*—Perman & Green

[57] ABSTRACT

Process for producing circuitized greensheets including multi-layer ceramic sub-laminates and composites comprising thin ceramic greensheets carrying and thin, fine line patterned conductive metal layers. The invention comprises releasably-supporting the thin greensheets on a temporary carrier support having an ablatable release layer, preferably over a patterned conductive layer, and filling the vias with conductive metal paste, whereby the thin greensheets are supported against warpage and distortion. The supported greensheets are formed as single layers, pairs and stacks thereof, as desired, and thereafter separated from the temporary support for use.

11 Claims, 3 Drawing Sheets

PROCESS FOR PRODUCING CIRCUITIZED LAYERS AND MULTILAYER CERAMIC SUB-LAMINATES AND COMPOSITES THEREOF

BACKGROUND OF THE INVENTION

1. Field of the Invention

The present invention relates to the production of circuitized layers and multi-layer ceramic laminates for electronic applications, and more particularly to the production of laminates from a plurality of dielectric ceramic greensheets and interposed patterned conductive circuit layers interconnected by conductive vias to form multilayer sub-laminate units which can be combined or stacked and sintered to form multilayer ceramic (MLC) composition packages comprising a large number of interconnected printed circuit layers for complex electronic applications.

The increasing demands for miniaturization and greater electrical capacity of electronic components has created production and performance problems. For example, miniaturization requires the use of thinner insulating ceramic greensheet layers, finer-line printed circuit conductive layers and smaller, more precise vias or bores through each greensheet layer to receive conductive paste and connect predetermined fine-line circuitry of the patterned conductive layers spaced by the insulating greensheet layers.

Thin greensheet layers, less than about 3 mils in thickness, are difficult to process into multi-layer ceramic laminates in the conventional production process because the thin greensheets distort greatly during normal processing, particularly during screening/post drying, and distorted or warped greensheets cannot be laminated into electrically-continuous packages.

A fine line printed circuit technology is also important because it provides extendibility of MLC technology beyond thick film screened lines and mechanically punched vias. With the current MLC production techniques of screening and punching, feature sizes are typically limited to a minimum line width of about 75 µm, a minimum via diameter of 100 µm, and a via grid of 275 µ. center to center. A method for routinely making submicron width lines, and vias with diameters as small as 50 µm on a 125 µm grid, is desirable. Finer lines and via grids will enable reduction of the number of layers with line traces, and a smaller via grid will enable direct joining of the chip C4 footprint to the vias. Both interchip wiring capability and power supply capability to chips will be enhanced. Module costs can be reduced by reducing the number of thin film wiring layers, and in some applications eliminating the use of thin film wiring layers. Thinner substrate and smaller module size are also important for those applications where the module is subject to size and weight constraints. In addition, eliminating the need for screening masks would reduce product development time, enhance flexibility of the package design, and, coupled with a low dielectric constant ceramic composite, such as a cordierite-silica mixture, would provide performance approaching that of polymer thin films.

BACKGROUND ART

It is known to produce multi-layer ceramic laminates and composites thereof for electronic applications, and reference is made to U.S. Pat. Nos. 4,799,984; 4,894,258; 4,929,295 and 5,085,720. The latter patent prevents or reduces distortion or shrinkage of the greensheet ceramic layers by maintaining pressure on the laminates during firing. U.S. Pat. No. 4,799,984 employs a rigid substrate as a support for the build-up of pre-punched greensheet layers and conductive layers during the production of multi-layer ceramic laminates. The substrate is retained in the process of U.S. Pat. No. 4,799,984 to become an integral part of the formed MLC.

SUMMARY OF THE INVENTION

The present invention provides a novel process for producing multi-layer ceramic laminates, and assemblies of such laminates, on a temporary releasable support surface comprising sequentially applying to such a support surface a plurality of pre-punched thin greensheet layers, preferably containing a high binder content, and a plurality of thin, fine-line patterned circuit layers one interposed between each pair of said greensheet layers, preferably in the form of decal circuit layers, and a plurality of fine pre-formed vias through each of said greensheet layers, filled with electro-conductive composition, to interconnect portions of the circuitry of different ones of said printed circuit layers, said vias being pre-formed and filled prior to stacking and lamination.

The present process enables the fabrication of an MLC body comprised of a hierarchy of wiring densities, comprised of layers produced using standard screening and punching methods, layers produced by the present sub-laminate process, and structures on the surface, such as those made by standard thin film processing.

The benefit of this structure is that it can provide a standard platform comprised of groundplanes and vias which can be combined with a set of personality layers produced by the present sub-laminate method. This structure can also be used to provide fanout layers within the MLC body.

The essential features of the novel process of the present invention comprise the use of rigid or flexible temporary support surfaces to support the thin ceramic greensheets and thin, fine-line printed circuit x- and y- conductor layers during the formation, stacking, laminating and/or sintering steps, whereby warpage and distortion of the thin ceramic greensheet layers is avoided even in cases where the content of binder material in such layers is high enough to provide excellent adhesion properties during the lamination step. The greensheet layers are either mechanically punched to form vias prior to lamination to the support surface, or the vias may be formed by the use of electron beam, laser or other non-mechanical means. The use of radiation means rather than a mechanical punch is preferred since a radiation beam can form very fine vias without the application of pressure to the relatively soft greensheet layers. In using pressure punching means to form the vias, care must be taken not to compress the thin greensheet layers and close or seal the vias being formed. In any event, the greensheet is supported during the metal paste screening and drying operations to prevent distortion or warpage of the greensheet.

The conductive patterned circuit layers preferably are applied by means which produce fine line circuitry in association with the thin layer greensheets. The application of conductive layers in the form of plated copper decals built on a temporary quartz or rigid glass, polymer film or metallic carrier over adhesive and an ablatable release layers is preferred since plated copper lines have a lower resistivity than screen-printed solder lines and since plated copper lines are rectangular in shape and have straight sidewalls as opposed to screen printed lines which generally are rounded. Moreover decal metallurgy permits greater precision and finer line detail.

The present process enables multi-layer ceramic (MLC) structures to be produced by several different routes, each of which involves releasably supporting the thin ceramic greensheet, such as a cordierite-based glass ceramic layer, on a temporary support surface, such as a quartz/glass carrier or polymer film while vias are formed in the greensheet and screened with electroconductive paste to fill the vias therein, and the paste is dried. This prevents warping or distortion of the thin greensheets, even in cases where the greensheets are formed from ceramic compositions which are high in binder content. Preferably, the thin greensheet can be applied over a releasable patterned conductive circuit or x-wiring and y-wiring layer which is preformed over an adhesive layer/ release layer on the surface of a carrier sheet, and the vias can be formed in the supported greensheet and screened with electroconductive paste and dried to form a "single layer". Next, a second carrier sheet carrying a similar releasable patterned circuit or x-wiring and y-wiring layer can be applied over and laminated to the screened greensheet to produce a tri-plate structure including a power/ground reference (high metal area coverage), or a "plane pair" which can remain bonded to one of the carrier sheets as a building block and be laminated to successive second "single layers" produced as discussed above, to form a multi-layer full x, y, referenced plane pair ceramic body on the first carrier support.

Alternatively, the aforementioned x, y, reference plane pairs can be released from their respective carrier sheets as free standing sub-laminates, and several sub-laminates can be stacked together and laminated to form a MLC.

A second route for producing multi-layer ceramic structures according to the present invention involves forming a plurality of single sheets, i.e., a thin greensheet applied over a patterned circuit layer releasably adhered to a carrier such as a quartz/glass support, via formed and screened with conductive paste to fill the vias therein, and dried, as discussed above. Next the single sheets are released from their respective carrier sheets, stacked together, with the non-circuitized surface of one single sheet in contact with the circuitized surface of the next single sheet, and laminated to form multi-layer ceramic structures.

As yet another alternative, thin greensheets can be formed and punched or machined with vias prior to lamination over a releasable patterned circuit layer which is preformed on the adhesive/ablative surface of a carrier sheet. Thereafter the individual supported greensheets are screened with conductive paste and dried to form via-filled single sheets which can be released from their support carriers, stacked and laminated to form multi-layer ceramic structures in the manner discussed hereinbefore.

For purposes of illustrating different embodiments of the present invention, reference is made to the accompanying drawings, in which.

Figure 8:
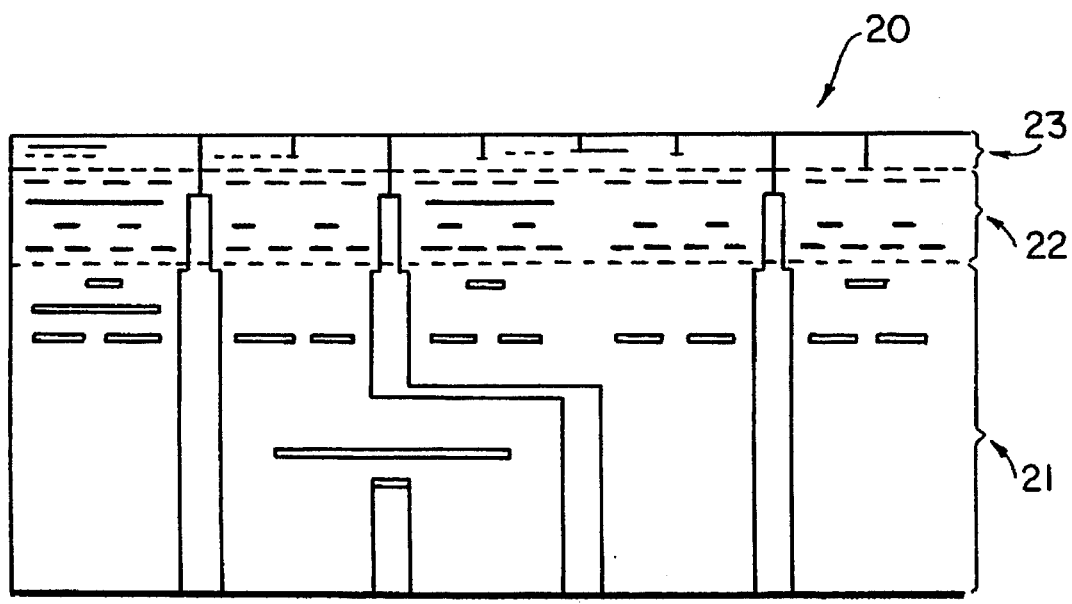

FIG. 8 illustrates a composite MLC body comprising a laminate of a plurality of different multi-layer ceramic bodies having different wiring densities, some of which are produced by standard production methods. Referring to the composite structure 20 of FIG. 8, level 21 comprises a conventional thick film MLC level such as a glass ceramic/ copper circuitizing layer of 75 μm to 100 μm wiring on a 400 μm via density, produced in conventional manner; Level 22 is an intermediate density level layer produced according to the present process, and comprising a glass ceramic/copper copper circuitizing layer of 37.5 to 75 m wiring on a 400 μm via density. Wiring level 23 comprises a conventional thin film wiring level, such as applied by conventional decal transfer means, comprising a polyimide/copper wiring layer of 12 μm on a 40 μm via signal layer.

DETAILED DESCRIPTION

Figure 1:
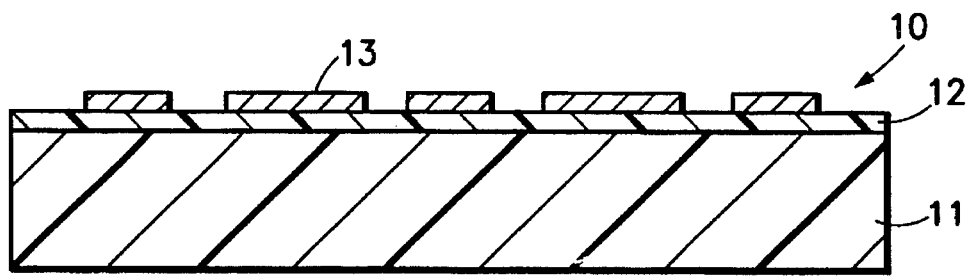
FIG. 1 is an enlarged sectional view of a temporary support such as a quartz/glass carrier layer or polymer film carrier having thereon an adhesive/ablative release layer bonding a patterned circuit layer such as a metallurgy decal layer to the carrier layer.

FIG. 1 illustrates a metallized carrier element 10 comprising a rigid quartz carrier layer 11 having thereon a photo-reactive ablative release layer 12 containing or coated with an adhesive binder material for bonding thereto the patterned electroconductive circuit layer 13, formed thereon by photolithographic means or transferred thereto in thin, fine line decal form.

The metallized carrier element 10 of FIG. 1 can be produced by applying to the cleaned, smooth surface of a quartz carrier layer 11 a thin layer of a solution of a photoreactive polymer such as a polyimide, a polymethyl methacrylate, or similar polymer and solidifying by evaporation of the solvent to form a release layer capable of being selectively ablated or evaporated by exposure to laser radiation, such as 308 nm or 351 nm excimer laser in the energy range of 100 to 200 ml/cm$^2$.

Figure 2:
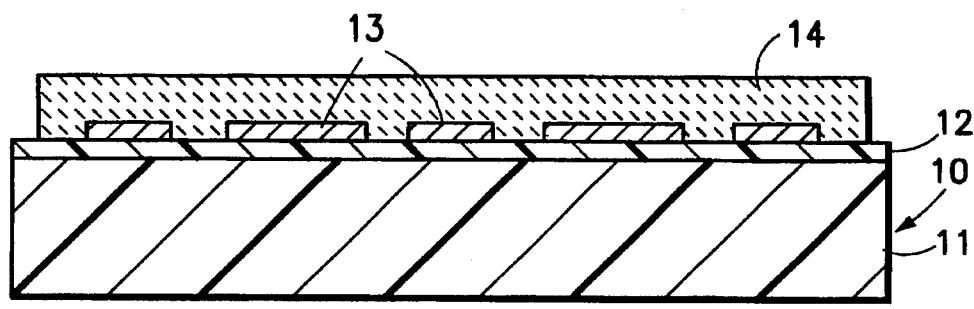
FIGS. 2 and 3 are enlarged sectional views of the lamination of the patterned carrier element of FIG. 1 and a thin ceramic greensheet, the greensheet being via-free in FIG. 2, and the greensheet being machined with vias and screened with electroconductive paste in FIG. 3, while supported by the carrier element, to form a single layer element.

For improved residual adhesion of the released patterned metallurgy layer 13 to the receiving surface of a greensheet to which it is being laminated, such as greensheet 14 of FIG. 2, it is preferred to coat the release layer 12 with a non-ablatable resin layer, such as polyvinyl butyral, which does not absorb radiation in the aforementioned wavelength range and therefore is not damaged by the ablation process.

Referring to FIG. 2, a plain unpunched greensheet 14 can be laminated to the metallized carrier element 10 of FIG. 1, as illustrated, or the greensheet can be pre-punched or machined to form vias therein prior to lamination to the element 10. Preferably the upper surface of the greensheet 14 is provided with vias 15, shown in FIG. 3, by first adhering a thin metallized masking film to said upper surface, and by machining the fine vias through the film and through the greensheet, such as by means of electron beam or laser beam or other non-mechanical means, in predetermined areas to interface with predetermined circuit locations of the patterned circuit layer 13A, as disclosed by commonly - assigned U.S. Pat. No. 3,956,052. The metallized film facilitates the application of electroconductive paste to fill the vias 15 by simple wiping since it masks the upper surface of the greensheet from exposure to the paste in background areas. After drying of the paste in the vias, to form conductive metallized vias 16, the metallized film is peeled away and discarded to produce a carrier - supported "single layer" element 17. Element 17 can be released from the carrier 11 by the application of the laser radiation against the underside of the carrier 11 to ablate the release layer 12 and produce the self-supporting "single layer" element 17 illustrated by FIG. 4.

A plurality of x-wired and y-wired single layer elements 17 can be stacked and laminated, the residual adhesive present on the surface of each greensheet carrying the patterned metallurgy 13 providing bonding strength for the opposite surface of the adjacent greensheet and fired to produce a MLC which can be bonded to integrated circuit chips and to interconnection means such as pinning or lead frames to connect the lowermost surface, as disclosed in U.S. Pat. No. 3,956,052.

Figure 3:
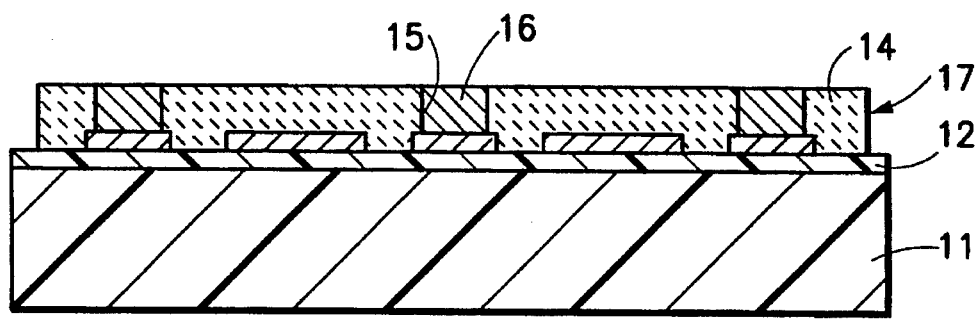
Figure 4:
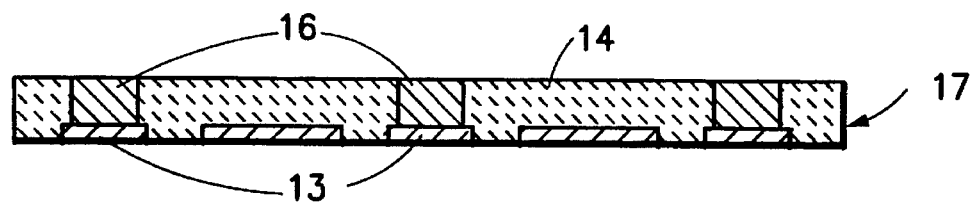
FIG. 4 is an enlarged sectional view of a single layer element produced according to FIG. 3 and released or separated from its carrier as a self-supporting patterned and via-filled greensheet.
Figure 5:
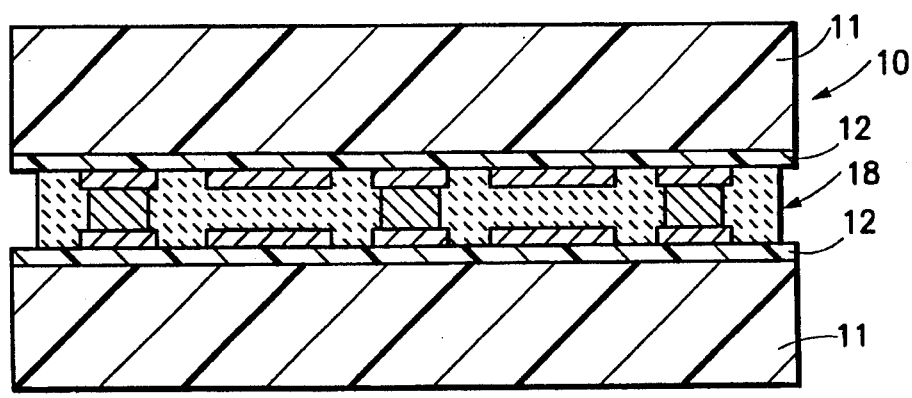
FIG. 5 is an enlarged sectional view of the lamination of a supported single layer element produced according to FIG. 3, and a second metallized carrier element produced according to FIG. 1 to form a plane pair element comprising a greensheet provided with via-connected x- and y- patterned circuit metallurgy on both surfaces.

Alternatively, the carrier-supported single layer element 17 of FIG. 3 may be converted to a pair element 18 by laminating a second metallized carrier element 10, as shown in FIG. 1 to the upper surface of the supported single layer element 17 of FIG. 3, as illustrated by FIG. 5. A power ground reference layer is applied to control the electrical cross-talk between related signal lines.

The formed pair element 18 can be released from both supports, as a self-supporting pair element by applying predetermined laser radiation against the rear surfaces of both carrier layers 11 to ablate the layers 12 and release the elements 18 for appropriate stacking, lamination and firing.

Figure 6:
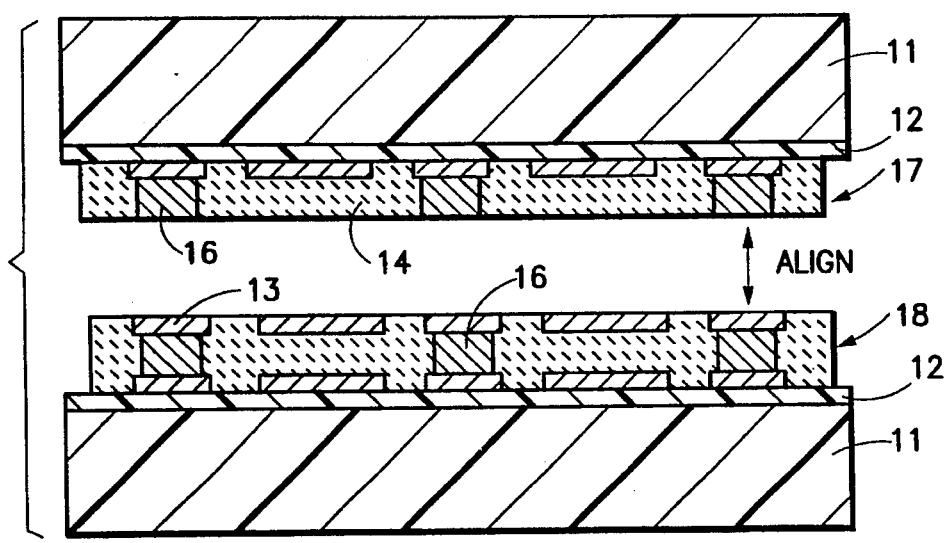
FIG. 6 is an enlarged sectional view illustrating the alignment of a supported pair element and a supported single layer element.
Figure 7:
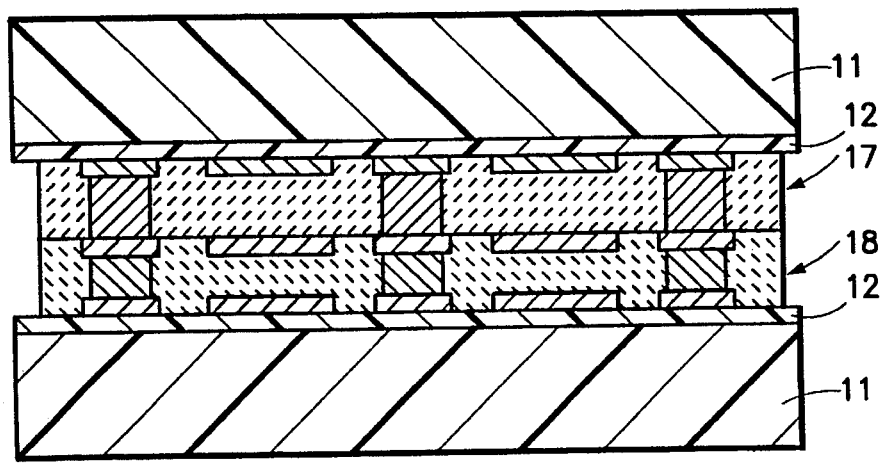
FIG. 7 illustrates the lamination of the elements of FIG. 4 to form a multi-layer ceramic which can be released from one carrier, for the addition of further single layer elements, according to FIG. 6, or can be released from both carriers and stacked and laminated with similar elements to form an MLC.

Alternatively, as shown by FIGS. 6 and 7, the pair element 18 of FIG. 5 can be released from one carrier layer 11 by ablating one release layer 12 while it remains supported by the second carrier layer 11. This permits carrier supported single layer elements 17, as shown in FIG. 3, to be aligned with and laminated to the supported pair element 18, as shown in FIGS. 6 and 7, followed by ablation of one of the release layers 12 for successive lamination thereto of additional single layer elements 17 to produce the desired multi-layer ceramic packages.

Thus, the present invention enables the use of very thin greensheet layers, less than about 3 mils in thickness, and the use of ceramic greensheet compositions, such as cordierite-based glass, alumina and glass or similar ceramic compositions, containing a high binder content, which can further reduce the sintered layer thickness and yield improvements in the bond strengths formed during lamination. Such enablement is made possible by the fact that the thin greensheet layers are always bonded to a temporary flexible or rigid carrier layer, such as quartz or polymer film when electroconductive via-fill paste is applied thereto and while the composite is dried. This has been found to stabilize the thin metallized greensheets against warpage or other distortion, and to allow for the formation of even thinner sintered greensheets due to the use of higher binder contents.

The present drawings illustrate a preferred embodiment of the present invention related to the use of thin ceramic greensheets having a thickness less than about 3 mils, and fine line conductive metal layers applied in the form of decals. However, as disclosed hereinbefore, the present process also applies to the use of greensheets which can be pre-punched or otherwise provided with vias prior to light lamination to the temporary carrier, and can be screened to fill the vias and form the x- and y- circuit layer after such lamination. The screened and patterned greensheet can be separated from the carrier for single layer use, or additional prepunched greensheet layers can be applied thereover, screened and patterned to produce multi-layer structures which can be released from the temporary carrier and laminated with other MLC structures.

While thin ceramic greensheets and fine line conductive circuitry are advantageous with respect to miniaturization, and while thin line circuitry provides very rapid signal propagation, thin line circuitry is much more susceptible to signal losses and is less reliable for longer interconnection distances. Intermediate size line circuitry does not require the use of decal application and is less susceptible to signal losses due to the larger cross-section of the conductive lines.

It will also be clear to those skilled in the art that the present process enables the fabrication of an MLC body comprised of a hierarchy of wiring densities. An example of such a structure is illustrated by FIG. 8. This structure is comprised of layers produced using standard screening and punching methods, layers produced by the present sub-laminate process, and structures on the surface thereof such as those made by standard thin film processing.

The advantage of the structure of FIG. 8 is that it can provide a standard platform comprised of groundplanes and vias, which can be combined with a set of personality layers produced by the present sub-laminate method. This structure can also be used to provide fanout layers within the MLC body. Such a structure is a hierarchical structure that is similar to that shown in FIG. 8 except that is does not include the Polyimide/Cu wiring layers.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. Process for producing circuitized ceramic greensheets while preventing warpage and distortion thereof, comprising the steps of:

(a) forming a thin ceramic greensheet;

(b) forming vias in said greensheet, either before or after step (f);

(c) applying an ablatable release layer to the surface of a temporary rigid carrier support;

(d) applying a thin non-ablatable, adhesive layer over said release layer;

(e) forming a conductive patterned circuit layer by plating such layer over said adhesive layer;

(f) lightly-laminating the thin ceramic greensheet of step (a) over said plated circuit layer;

(g) applying conductive metal paste to fill the vias and to form interconnections with the patterned conductive circuit layer formed on the adhesive-coated surface of said carrier support to form a circuitized greensheet; and (h) ablating said release layer to separate said circuitized greensheet from said temporary rigid carrier support.

2. Process according to claim 1 which comprises forming a plurality of said circuitized greensheets and laminating them to one another to form a multilayer ceramic laminate.

3. Process according to claim 1 in which said thin ceramic greensheet of step (a) has releasably-adhered to the upper surface thereof a thin masking film, and step (b) comprises the steps of machining vias through said film and through said greensheet in predetermined areas, conducting step (g) of claim 1 by wiping the conductive metal paste over the surface of said masking film to fill said vias therewith, and peeling said masking film from said via-filled thin greensheet to form said circuitized greensheet.

4. Process according to claim 1 in which step (d) comprises applying a non-ablatable thin adhesive layer of polyvinyl butyral resin over said release layer.

5. Process according to claim 4 in which said release layer comprises a photo-reactive polymeric composition which ablates when exposed to radiation to which said adhesive layer is substantially inert, and applying said radiation to release the adhesive layer and patterned conductive layer from the temporary carrier support.

6. Process according to claim 1 which comprises the further steps of stacking a plurality of said circuitized greensheets and firing the stack to form a multi-layer ceramic body.

7. Process according to claim 1 which comprises the further step of forming a second thin patterned conductive layer over the supported circuitized greensheet of step (g), prior to step (h), by (1) applying an abratable release layer to a second rigid carrier; (2) plating a second thin patterned conductive layer over said release layer, (3) aligning said second thin patterned conductive layer with the upper surface of the via-filled greensheet of step (g), (4) laminating said aligned sheets to form a supported pair comprising said via-filled greensheet layer having bonded to the opposed surfaces thereof said patterned conductive layers, and (5) conducting step (h) to release both of said greensheet layers from both of said temporary carriers as a self-supporting pair.

8. Process according to claim 7 in which said pair is released from one of said temporary carriers, aligned with another supported circuitized greensheet produced according to claim 1, with the filled vias of the greensheet of the circuitized greensheet in contact with a patterned conductive layer of the said pair, and laminated to form a supported multilayer ceramic.

9. Process according to claim 8 comprising releasing said multi-layer ceramic from both of said temporary carriers as a self-supporting sub-laminate, and stacking, laminating and firing a plurality of said sublaminates to form multi-layer ceramic body.

10. Process according to claim 8 comprising releasing said multi-layer ceramic from one of said temporary carriers, aligning it with another supported circuitized greensheet produced according to claim 1, and repeating the steps of claim 8 to produce a multi-layer ceramic incorporating another circuitized greensheet.

11. Process according to claim 1 in which the plated circuit layer of step (e) comprises plated copper.

* * * * *